United States Patent [19]

Goebel et al.

[11] Patent Number: 5,686,319
[45] Date of Patent: Nov. 11, 1997

[54] METHOD FOR PRODUCING A DIODE

[75] Inventors: Herbert Goebel; Vesna Göbel, both of Reutlingen, Germany

[73] Assignee: Robert Bosch GmbH, Stuttgart, Germany

[21] Appl. No.: 544,417

[22] Filed: Oct. 10, 1995

[30] Foreign Application Priority Data

Dec. 10, 1994 [DE] Germany .................... 44 44 055.3

[51] Int. Cl.[6] .................................................. H01L 21/04
[52] U.S. Cl. ................ 437/15; 437/904; 148/DIG. 12; 148/DIG. 39; 257/469; 257/551
[58] Field of Search ............. 437/15, 904; 148/DIG. 12, 148/DIG. 39; 257/469, 551

[56] References Cited

U.S. PATENT DOCUMENTS

| 3,602,778 | 8/1971 | Ura ............................ 437/904 |
| 3,638,301 | 2/1972 | Matsuura ..................... 437/904 |
| 4,891,329 | 1/1990 | Reisman et al. ............ 148/DIG. 12 |
| 4,897,362 | 1/1990 | Delgado et al. ............... 437/26 |
| 5,232,870 | 8/1993 | Ito et al. .................... 148/DIG. 12 |

FOREIGN PATENT DOCUMENTS 0128112  6/1987  Japan ........................... 437/15

*Primary Examiner*—John Niebling
*Assistant Examiner*—Long Pham
*Attorney, Agent, or Firm*—Kenyon & Kenyon

[57] ABSTRACT

In a method for producing a diode, a first, strongly positively doped silicon wafer is bonded in accordance with the silicon fusion method to a second, weakly negatively doped silicon wafer, and subsequently the weakly negatively doped second silicon wafer is ground down to a predetermined thickness. A chromium layer which contains a small percentage of arsenic is used for resistive contact-making on the negatively doped second silicon wafer. In this way, a diode is obtained which has a small forward voltage in conjunction with a precise breakdown voltage.

9 Claims, 1 Drawing Sheet

METHOD FOR PRODUCING A DIODE

BACKGROUND INFORMATION

A diode and a method for producing a diode are described in German Patent Application No. DE 41 33 820, the pn junction of the diode being produced by bonding a positively doped silicon wafer with a negatively doped silicon wafer in accordance with the silicon fusion method at a temperature of 1080° C. The negatively doped silicon wafer has a weakly doped layer and a strongly doped layer. The weakly doped layer is bonded onto the positively doped silicon wafer.

It is further known to produce so-called epitaxial diodes with the aid of epitaxially applied layers, for example a thin, weakly negatively doped silicon layer being applied epitaxially to a strongly positively doped silicon wafer. This is carried out at a temperature of 1250° C.

SUMMARY OF THE INVENTION

The method according to the present invention has the advantage that the diode, preferably a zener diode, can be produced in a cost-effective manner, since a costly doping procedure is dispensed with. Use can be made of a strongly doped p-type wafer which is thick enough for handling, with the result that there is no need for any deep p-doping.

It is a further advantage that a particularly low-loss diode is produced, since the forward voltage is particularly low. It is an additional advantage that the breakdown voltage is set very precisely. In comparison with epitaxial diodes, which are produced by means of an applied epitaxial layer, a considerably lower temperature is required for a relatively short time in the case of the silicon fusion method, with the result that a very distinct pn junction is produced. In contrast with epitaxial diodes, auto-doping (doping of the weakly doped layer from the strongly doped layer) of the weakly doped layer is reliably prevented. In contrast, the diode according to the present invention has the advantage that, in spite of the weak negative doping, a resistive contact having a small contact resistance is achieved without any additional doping.

It is particularly advantageous to apply chromium as an adhesion layer to the weakly negatively doped layer, a small percentage of arsenic being admixed with the chromium layer. A good resistive contact is achieved with a percentage (percent by weight) of 0.5 to 10% and in particular with a percentage of 1 to 5%.

DETAILED DESCRIPTION

Figure 1:
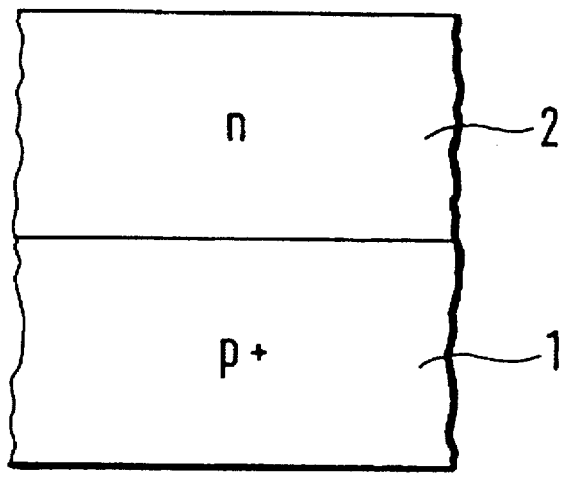
FIG. 1 shows a strongly p-doped layer and a weakly n-doped layer.

FIG. 1 diagrammatically shows a strongly positively doped silicon wafer 1, which has been joined in accordance with the silicon fusion method to a weakly negatively doped silicon wafer 2. The silicon fusion method is described in detail, for example, in German Patent Application No. DE 41 33 820. The temperature in the silicon fusion method is preferably in the range of 1000° C. to 1100° C. With this temperature range, firstly, good joining is achieved between the silicon wafers and, secondly, the doping of the weakly doped silicon wafer is kept as low as possible. An abrupt pn junction is obtained.

Instead of the strongly positively doped silicon wafer 1 and the weakly negatively doped silicon wafer 2, use may also be made of a strongly negatively doped silicon wafer and a weakly positively doped silicon wafer. A doping of $10^{20}$ atoms per cubic centimeter is used, for example, for the strongly positively doped silicon wafer 1. The weakly negatively doped silicon wafer 2 has, in accordance with the desired breakdown voltage, a doping of $5\times10^{16}$ to $1\times10^{18}$ atoms per cubic centimeter.

After fusion to the strongly positively doped silicon wafer 1, the weakly doped silicon wafer 2 is ground to a predetermined thickness, with the result that the series resistance of the weakly negatively doped silicon wafer 2 becomes as small as possible in order to achieve a minimal forward voltage, a predetermined breakdown voltage, however, being retained. At a thickness of the weakly negatively doped silicon wafer 2 of 25 µm, a forward voltage of 0.9 V is achieved in the case of a 100 A current, the desired breakdown voltage of 40 V being retained. Further grinding of the weakly negatively doped silicon wafer 2 reduces the breakdown voltage abruptly.

The silicon fusion method is advantageous in this case since, for reliable handling, use may be made of a sufficiently thick, strongly positively doped silicon wafer, and deep p-doping is unnecessary. A preferred thickness of the strongly positively doped silicon wafer 1 is between 200 and 600 µm. Thicknesses of the negatively doped second wafer of 100 to 25 µm are advantageous for a low forward voltage. Corresponding values apply in the case of a strongly negatively doped silicon wafer and a weakly positively doped silicon wafer.

Figure 2:
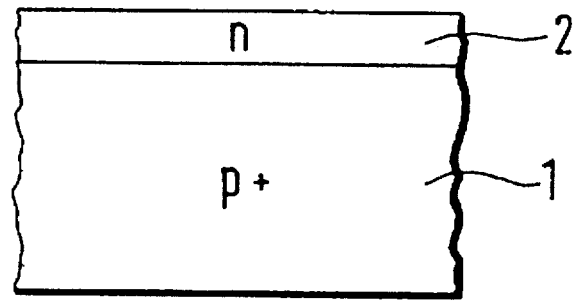
FIG. 2 shows a strongly p-doped layer and a thinned, weakly n-doped layer.
Figure 3:
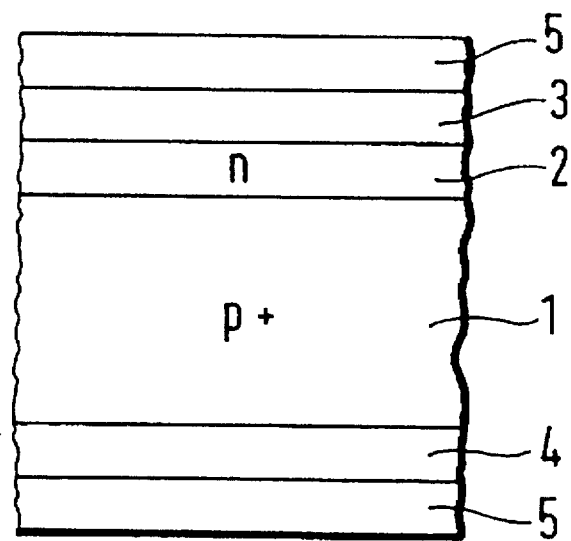
FIG. 3 shows a diode having a complete, solderable metalization layer on both sides.

FIG. 2 shows a strongly positively doped silicon wafer 1, onto which is bonded a weakly negatively doped silicon wafer 2 which is ground to a thickness of 25 µm. The thinned, weakly negatively doped silicon wafer 2 has applied to it, as is illustrated in FIG. 3, a first metalization layer 3, which comprises chromium and contains a small percentage of arsenic, this percentage being between 0.5 and 10%. Good resistive contacts are achieved between the weakly negatively doped silicon wafer 2 and the chromium layer if the chromium layer has 1 to 5% of arsenic. Very good resistive properties are achieved with 1% of arsenic. A second metalization layer 4 made of pure chromium is applied to the strongly positively doped silicon wafer 1. Subsequently, as is illustrated in FIG. 3, a third metalization layer 5 made of nickel and gold or nickel and silver is applied to the chromium layer 3 with arsenic and to the pure chromium layer 4. The metalization layers 3, 4, 5 are applied in a particularly simple manner by means of a single-sided or double-sided sputtering method. Consequently, the entire diode is produced without a diffusion process using the method described.

Another way of producing a resistive contact with regard to the weakly doped silicon wafer 2 is achieved in that a highly negative surface layer, which is strongly doped with phosphorus and to which one of the known metalization layers (for example, pure metal layers of Cr/Ni/Au or Ag) is applied, is produced on the weakly negatively doped second silicon wafer 2 with the aid of diffusion.

What is claimed is:

1. A method for producing a diode, comprising the steps of:

joining, by silicon fusion, a first silicon wafer having a first doping to a second silicon wafer having a second doping, the second doping being lower than the first doping and having an opposite charge type of the first doping; and grinding the second silicon wafer to a thickness after the silicon fusion.

2. The method according to claim 1, wherein the first silicon wafer is n-doped and the second silicon wafer is p-doped.

3. The method according to claim 1, wherein the first silicon wafer is p-doped and the second silicon wafer is n-doped.

4. The method according to claim 1, wherein the diode is a zener diode.

5. The method according to claim 1, wherein the thickness is in a range between 10 and 100 µm.

6. The method according to claim 1, wherein the silicon fusion is carried out at a temperature of between 1000° C. and 1100° C.

7. The method according to claim 1, wherein the first silicon wafer has a thickness of between 200 and 600 µm.

8. The method according to claim 1, wherein the second silicon wafer is lightly N-type doped, and further comprising the step of applying a layer including mixed chromium and arsenic to the second silicon wafer.

9. The method according to claim 8, wherein the layer includes between 0.5 and 10% of arsenic.

* * * * *